United States Patent
Bolduc et al.

(10) Patent No.: US 9,758,091 B2
(45) Date of Patent: Sep. 12, 2017

(54) VEHICLE SYSTEM AND METHOD FOR ACTIVATING HAZARD LIGHTS DURING BATTERY DISCONNECT EVENTS

(71) Applicant: FORD GLOBAL TECHNOLOGIES, LLC, Dearborn, MI (US)

(72) Inventors: Robert Bolduc, Allen Park, MI (US); Masahiro Kimoto, Plymouth, MI (US); Ken Jon Cunningham, Livonia, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 14/714,583

(22) Filed: May 18, 2015

(65) Prior Publication Data

US 2016/0339837 A1  Nov. 24, 2016

(51) Int. Cl.

| | | |
|---|---|---|
| *B60Q 1/46* | (2006.01) | |
| *B60L 11/18* | (2006.01) | |
| *B60L 3/00* | (2006.01) | |
| *B60Q 1/50* | (2006.01) | |
| *B60T 1/00* | (2006.01) | |
| *B60K 28/14* | (2006.01) | |
| *B60R 16/00* | (2006.01) | |
| *B60W 10/108* | (2012.01) | |
| *B60C 23/02* | (2006.01) | |

(Continued)

(52) U.S. Cl.
CPC .............. *B60Q 1/46* (2013.01); *B60L 3/0046* (2013.01); *B60L 11/1851* (2013.01); *B60Q 1/50* (2013.01); *B60C 23/02* (2013.01); *B60C 23/04* (2013.01); *B60C 23/0416* (2013.01); *B60K 28/14* (2013.01); *B60L 7/00* (2013.01); *B60L 7/10* (2013.01); *B60L 7/26* (2013.01); *B60L 7/28* (2013.01); *B60L 11/18* (2013.01); *B60L 11/1805* (2013.01); *B60L 15/10* (2013.01); *B60R 16/00* (2013.01); *B60R 21/013* (2013.01); *B60T 1/005* (2013.01); *B60T 7/12* (2013.01); *B60T 7/22* (2013.01); *B60T 8/17* (2013.01); *B60T 8/885* (2013.01); *B60W 10/04* (2013.01); *B60W 10/108* (2013.01); *F16H 9/04* (2013.01); *F16H 61/66* (2013.01); *G05D 3/00* (2013.01); *G06F 17/00* (2013.01); *G06G 7/78* (2013.01); *H01Q 1/3233* (2013.01)

(58) Field of Classification Search
CPC ...... B60L 7/00; B60L 7/10; B60L 7/26; B60L 7/28; B60L 11/1805; B60L 15/10; B60L 11/18; B60L 11/1851; B60L 3/0046; B60C 23/02; B60C 23/04; B60C 23/0416; H01Q 1/3233; F16H 61/66; F16H 9/04; B60W 10/108; B60W 10/04; B60T 8/17; B60T 1/005; B60T 8/885; B60T 7/12; B60T 7/22; G06F 17/00; B60R 21/013; G05D 3/00; G06G 7/78; B60K 28/14; B60Q 1/46

See application file for complete search history.

(56) References Cited

U.S. PATENT DOCUMENTS

| | | |
|---|---|---|
| 6,646,845 B1 | 11/2003 | Turner et al. |
| 8,428,802 B2 | 4/2013 | Kizaki |

(Continued)

FOREIGN PATENT DOCUMENTS

DE  102004002770 A1  8/2005

*Primary Examiner* — Behrang Badii
(74) *Attorney, Agent, or Firm* — Carlson, Gaskey & Olds

(57) ABSTRACT

A method according to an exemplary aspect of the present disclosure includes, among other things, activating hazard lights of an electrified vehicle in response to a high voltage battery disconnect event.

16 Claims, 3 Drawing Sheets

(51) Int. Cl.
  B60C 23/04    (2006.01)
  B60T 7/12     (2006.01)
  B60L 15/10    (2006.01)
  B60W 10/04    (2006.01)
  B60R 21/013   (2006.01)
  B60L 7/10     (2006.01)
  B60T 8/88     (2006.01)
  G06F 17/00    (2006.01)
  F16H 61/66    (2006.01)
  H01Q 1/32     (2006.01)
  B60T 7/22     (2006.01)
  G05D 3/00     (2006.01)
  F16H 9/04     (2006.01)
  B60L 7/26     (2006.01)
  B60L 7/28     (2006.01)
  B60L 7/00     (2006.01)
  B60T 8/17     (2006.01)
  G06G 7/78     (2006.01)

(56) References Cited

U.S. PATENT DOCUMENTS

| | | | |
|---|---|---|---|
| 8,483,945 B2* | 7/2013 | Herink | B60T 7/22 |
| | | | 180/232 |
| 9,328,807 B2* | 5/2016 | Carter | B60L 11/1805 |
| 2003/0164774 A1* | 9/2003 | King | B60C 23/0416 |
| | | | 340/870.28 |
| 2004/0035656 A1* | 2/2004 | Anwar | B60L 7/26 |
| | | | 188/161 |
| 2010/0131164 A1* | 5/2010 | Carter | B60L 11/1805 |
| | | | 701/61 |
| 2013/0054101 A1* | 2/2013 | Harries | B60K 31/00 |
| | | | 701/54 |
| 2013/0060412 A1* | 3/2013 | Nakagawara | B60T 1/005 |
| | | | 701/22 |
| 2013/0158776 A1* | 6/2013 | Rini | G06F 17/00 |
| | | | 701/29.4 |

\* cited by examiner

VEHICLE SYSTEM AND METHOD FOR ACTIVATING HAZARD LIGHTS DURING BATTERY DISCONNECT EVENTS

TECHNICAL FIELD

This disclosure relates to a vehicle system and method for an electrified vehicle. The vehicle system is configured to activate one or more hazard lights of the electrified vehicle in response to high voltage battery disconnect events.

BACKGROUND

The need to reduce fuel consumption and emissions in vehicles is well known. Therefore, vehicles are being developed that reduce or completely eliminate reliance on internal combustion engines. Electrified vehicles are one type of vehicle currently being developed for this purpose. In general, electrified vehicles differ from conventional motor vehicles because they are selectively driven by one or more battery powered electric machines. Conventional motor vehicles, by contrast, rely exclusively on an internal combustion engine to drive the vehicle.

Electrified vehicle powertrains are typically equipped with a high voltage battery having a plurality of battery cells that store electrical power for powering the electric machines and other electric loads. During certain vehicle fault conditions, the high voltage battery may be intentionally disconnected from the vehicle's high voltage electrical bus, thereby resulting in the loss of vehicle motive power.

SUMMARY

A method according to an exemplary aspect of the present disclosure includes, among other things, activating hazard lights of an electrified vehicle in response to a high voltage battery disconnect event.

In a further non-limiting embodiment of the foregoing method, the activating step is performed if a speed of the electrified vehicle exceeds a predefined speed threshold.

In a further non-limiting embodiment of either of the foregoing methods, the activating step is performed if a power request from an operator of the electrified vehicle exceeds a predefined power request threshold.

In a further non-limiting embodiment of any of the foregoing methods, the activating step is performed if a speed of the electrified vehicle exceeds a predefined speed threshold and a power request from an operator of the electrified vehicle exceeds a predefined power request threshold.

In a further non-limiting embodiment of any of the foregoing methods, the high voltage battery disconnect event indicates that the electrified vehicle has lost motive power.

In a further non-limiting embodiment of any of the foregoing methods, the activating step includes automatically flashing the hazard lights without a specific request from a vehicle operator.

In a further non-limiting embodiment of any of the foregoing methods, the method includes automatically flashing the hazard lights in a first flashing pattern in response to the high voltage battery disconnect event and flashing the hazard lights in a second, different flashing pattern in response to a specific request from a vehicle operator.

In a further non-limiting embodiment of any of the foregoing methods, the method includes, prior to the activating step, monitoring a high voltage battery of the electrified vehicle for fault conditions.

In a further non-limiting embodiment of any of the foregoing methods, the method includes disconnecting the high voltage battery from a high voltage bus to cause the high voltage battery disconnect event.

In a further non-limiting embodiment of any of the foregoing methods, the activating step includes flashing the hazard lights to provide a visual warning to a vehicle nearby the electrified vehicle if one or more additional vehicle conditions have been met in addition to the high voltage battery disconnect event.

A vehicle system according to another exemplary aspect of the present disclosure includes, among other things, a high voltage battery and at least one control module configured to monitor the high voltage battery and command a visual warning in response to a disconnect event of the high voltage battery.

In a further non-limiting embodiment of the foregoing vehicle system, the at least one control module includes a first control module and a second control module in communication with the first control module.

In a further non-limiting embodiment of either of the foregoing vehicle systems, the first control module is configured to monitor the high voltage battery and the second control module is configured to command the visual warning.

In a further non-limiting embodiment of any of the foregoing vehicle system, the first control module and the second control module communicate over a communication link.

In a further non-limiting embodiment of any of the foregoing vehicle systems, a hazard light is configured to provide the visual warning.

In a further non-limiting embodiment of any of the foregoing vehicle systems, a low voltage battery is configured to power the hazard light during the disconnect event.

In a further non-limiting embodiment of any of the foregoing vehicle systems, a switch is movable between an open position in which the low voltage battery is decoupled from the hazard light and a closed position in which the low voltage battery is coupled to the hazard light during the disconnect event.

In a further non-limiting embodiment of any of the foregoing vehicle systems, at least one contactor is configured to selectively disconnect the high voltage battery from a high voltage load to create the disconnect event.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

The various features and advantages of this disclosure will become apparent to those skilled in the art from the following detailed description. The drawings that accompany the detailed description can be briefly described as follows.

DETAILED DESCRIPTION

This disclosure describes a vehicle system and method for controlling an electrified vehicle. In some embodiments, the hazard lights of the electrified vehicle are activated in response to a high voltage battery disconnect event. The high voltage battery disconnect event may indicate that the electrified vehicle has lost motive power. Flashing the hazard lights provides a visual warning to drivers of nearby vehicles of such a loss of motive power. In some embodiments, the hazard lights are activated in response to a high voltage battery disconnect event if certain additional vehicle conditions are met. These and other features are discussed in greater detail in the following paragraphs of this detailed description.

Figure 1:
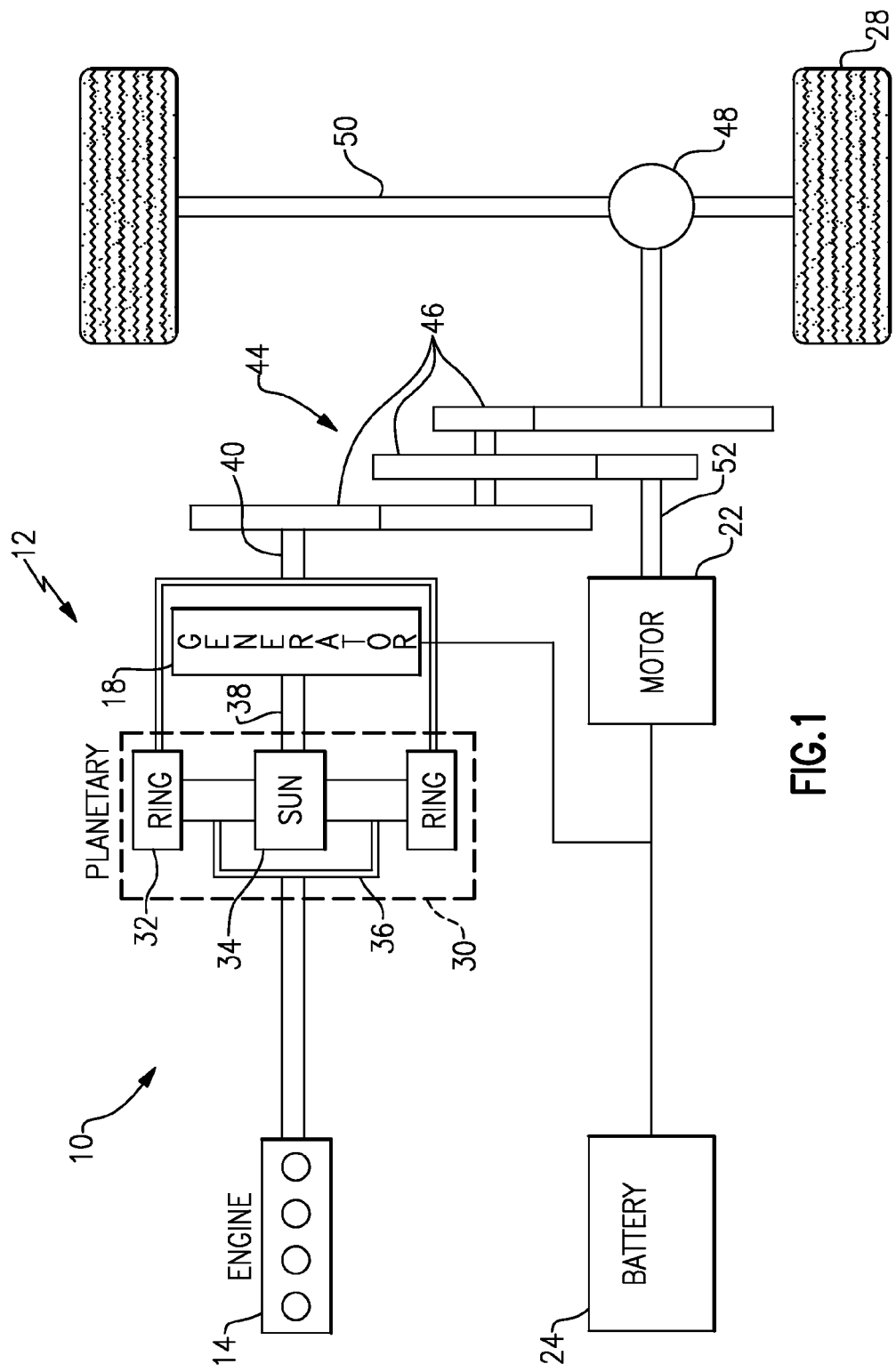
FIG. 1 schematically illustrates a powertrain of an electrified vehicle.

FIG. 1 schematically illustrates a powertrain 10 for an electrified vehicle 12. Although depicted as a hybrid electric vehicle (HEV), it should be understood that the concepts described herein are not limited to HEV's and could extend to other electrified vehicles, including, but not limited to, plug-in hybrid electric vehicles (PHEV's), battery electric vehicles (BEV's) and fuel cell vehicles.

In one embodiment, the powertrain 10 is a power-split powertrain system that employs a first drive system and a second drive system. The first drive system includes a combination of an engine 14 and a generator 18 (i.e., a first electric machine). The second drive system includes at least a motor 22 (i.e., a second electric machine), the generator 18, and a battery 24. In this example, the second drive system is considered an electric drive system of the powertrain 10. The first and second drive systems generate torque to drive one or more sets of vehicle drive wheels 28 of the electrified vehicle 12. Although a power-split configuration is shown, this disclosure extends to any hybrid or electric vehicle including full hybrids, parallel hybrids, series hybrids, mild hybrids or micro hybrids.

The engine 14, which in one embodiment is an internal combustion engine, and the generator 18 may be connected through a power transfer unit 30, such as a planetary gear set. Of course, other types of power transfer units, including other gear sets and transmissions, may be used to connect the engine 14 to the generator 18. In one non-limiting embodiment, the power transfer unit 30 is a planetary gear set that includes a ring gear 32, a sun gear 34, and a carrier assembly 36.

The generator 18 can be driven by the engine 14 through the power transfer unit 30 to convert kinetic energy to electrical energy. The generator 18 can alternatively function as a motor to convert electrical energy into kinetic energy, thereby outputting torque to a shaft 38 connected to the power transfer unit 30. Because the generator 18 is operatively connected to the engine 14, the speed of the engine 14 can be controlled by the generator 18.

The ring gear 32 of the power transfer unit 30 may be connected to a shaft 40, which is connected to vehicle drive wheels 28 through a second power transfer unit 44. The second power transfer unit 44 may include a gear set having a plurality of gears 46. Other power transfer units may also be suitable. The gears 46 transfer torque from the engine 14 to a differential 48 to ultimately provide traction to the vehicle drive wheels 28. The differential 48 may include a plurality of gears that enable the transfer of torque to the vehicle drive wheels 28. In one embodiment, the second power transfer unit 44 is mechanically coupled to an axle 50 through the differential 48 to distribute torque to the vehicle drive wheels 28.

The motor 22 can also be employed to drive the vehicle drive wheels 28 by outputting torque to a shaft 52 that is also connected to the second power transfer unit 44. In one embodiment, the motor 22 and the generator 18 cooperate as part of a regenerative braking system in which both the motor 22 and the generator 18 can be employed as motors to output torque. For example, the motor 22 and the generator 18 can each output electrical power to the battery 24.

The battery 24 is an exemplary electrified vehicle battery. The battery 24 may be configured as a high voltage traction battery pack that includes a plurality of battery cells capable of outputting electrical power to operate the motor 22 and the generator 18, among other components. Other types of energy storage devices and/or output devices can also be used to electrically power the electrified vehicle 12.

In one non-limiting embodiment, the electrified vehicle 12 has two basic operating modes. The electrified vehicle 12 may operate in an Electric Vehicle (EV) mode where the motor 22 is used (generally without assistance from the engine 14) for vehicle propulsion, thereby depleting the battery 24 state of charge up to its maximum allowable discharging rate under certain driving patterns/cycles. The EV mode is an example of a charge depleting mode of operation for the electrified vehicle 12. During EV mode, the state of charge of the battery 24 may increase in some circumstances, for example due to a period of regenerative braking. The engine 14 is generally OFF under a default EV mode but could be operated as necessary based on a vehicle system state or as permitted by the operator.

The electrified vehicle 12 may additionally operate in a Hybrid (HEV) mode in which the engine 14 and the motor 22 are both used for vehicle propulsion. The HEV mode is an example of a charge sustaining mode of operation for the electrified vehicle 12. During the HEV mode, the electrified vehicle 12 may reduce the motor 22 propulsion usage in order to maintain the state of charge of the battery 24 at a constant or approximately constant level by increasing the engine 14 propulsion. The electrified vehicle 12 may be operated in other operating modes in addition to the EV and HEV modes within the scope of this disclosure.

Figure 2:
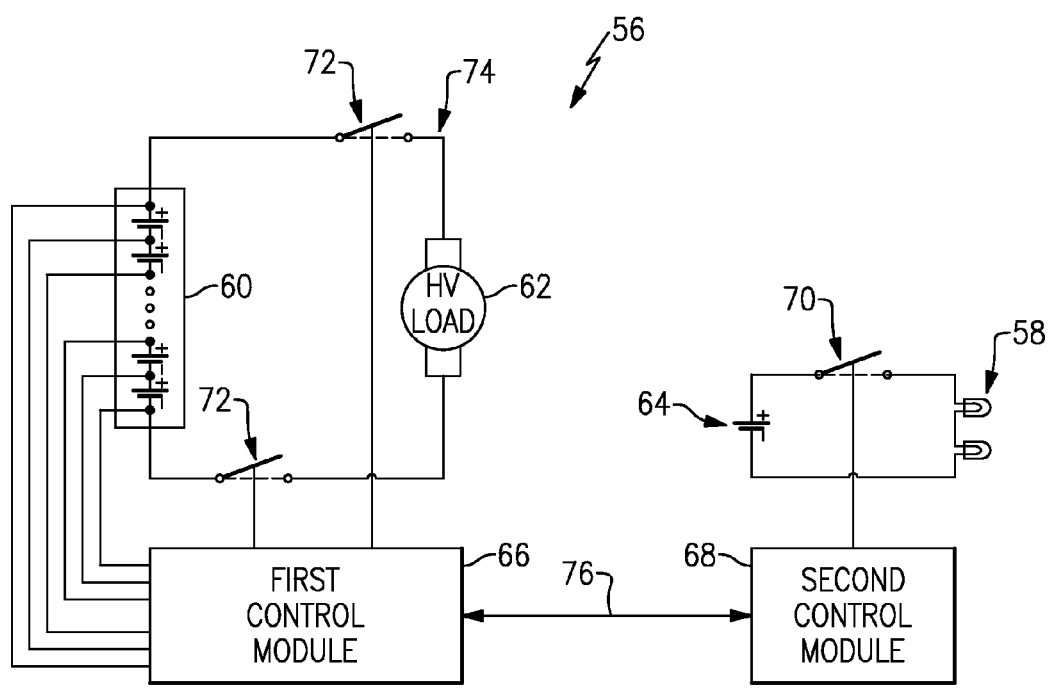
FIG. 2 schematically illustrates a vehicle system of an electrified vehicle.

FIG. 2 is a highly schematic depiction of a vehicle system 56 that may be incorporated into a vehicle, such as the electrified vehicle 12 of FIG. 1. The vehicle system 56 is adapted to activate one or more hazard lights 58 of the electrified vehicle 12 when the electrified vehicle loses motive power. Stated another way, the vehicle system 56 is designed to automatically provide a visual warning to drivers of nearby vehicles, by flashing the hazard lights 58, in response to high voltage battery disconnect events that result in the electrified vehicle losing motive power.

In one non-limiting embodiment, the exemplary vehicle system 56 includes a high voltage battery 60, a high voltage load 62, a low voltage battery 64, hazard lights 58, a first control module 66 and a second control module 68. These and additional components of the vehicle system 56 are described below.

The high voltage battery 60 may include a plurality of battery cells, capacitors, or other energy storage devices that are interconnected relative to one another to form the high voltage battery 60. The energy storage devices of the high voltage battery 60 store electrical energy that may be supplied to power various loads residing onboard an electrified vehicle. In a non-limiting embodiment, the high voltage battery 60 is capable of producing at least 100 volts of electricity. The high voltage battery 60 may supply this electrical power to the high voltage load 62 for providing motive power to the electrified vehicle. In a non-limiting embodiment, the high voltage load 62 is an electric machine such as an electric motor, a generator, or a combined motor/generator.

One or more contactors 72 may be employed to selectively open and close a connection between the high voltage battery 60 and the high voltage load 62. In one embodiment, the contactors 72 act as high voltage relays for electronically switching a supply current to the high voltage load 62. For example, the contactors 72 may couple or decouple the high voltage power generated in the high voltage battery 60 to or from the high voltage load 62. When in closed positions (shown in phantom lines), the contactors 72 couple the high voltage battery 60 to the high voltage load 62 over a high voltage bus 74. Alternatively, when the contactors 72 are in open positions, the high voltage battery 60 is decoupled or disconnected from the high voltage load 62.

The low voltage battery 64 may supply electrical power to various low voltage electrical loads (e.g., lighting systems, logic circuitry, etc.) of the electrified vehicle. For example, the low voltage battery 64 may power the hazard lights 58. In a non-limiting embodiment, the low voltage battery 64 is a 12V battery. The low voltage battery 64 may be selectively connected to and disconnected from the hazard lights 58 using a switch 70.

The first control module 66 and the second control module 68 may be part of an overall vehicle control unit, such as a vehicle system controller (VSC) or could alternatively be stand-alone control units separate from the VSC. In one embodiment, the first control module 66 and the second control module 68 include executable instructions for interfacing with and commanding operation of various components of the vehicle system 56. The first control module 66 and the second control module 68 may both include multiple inputs and outputs for interfacing with the various components, and may include processing units and non-transitory memory for executing the various control strategies and modes of the vehicle system 56.

In a non-limiting embodiment, the first control module 66 controls operation of at least the high voltage battery 60 and the contactors 72 of the vehicle system 56. For example, the first control module 66 may monitor temperatures of the battery cells of the high voltage battery 60, may monitor and control the state of charge (SOC) of the high voltage battery 60, may control charging and discharging operations of the battery cells of the high voltage battery 60, and may control opening and closing of the contactors 72. These are but non-limiting examples of the many potential functions of the first control module 66 of the vehicle system 56.

In another embodiment, the second control module 68 controls operation of at least the low voltage battery 64 and the switch 70 for activating the hazard lights 58 of the vehicle system 56. For example, in a non-limiting embodiment, the second control module 68 may command the switch 70 closed (shown in phantom lines) to activate the hazard lights 58 using power from the low voltage battery 64. The second control module 68 may include many other functions in addition to these functions.

The first control module 66 and the second control module 68 may communicate with one another over a communication link 76. In one non-limiting embodiment, the communication link 76 is a controller area network designed to allow the first control module 66 and the second control module 68 to communicate with one another and with other control modules.

During certain fault conditions, such as battery cell overcharge and/or battery cell over-discharging conditions, the first control module 66 may command the contactors 72 open to disconnect the high voltage battery 60 from the high voltage bus 74, and thus, disconnect the high voltage battery 60 from the high voltage load 62. This is referred to as a "high voltage battery disconnect event" and results in the electrified vehicle losing motive power. The first control module 66 may communicate a signal over the communication link 76 to the second control module 68 in response to detecting a high voltage battery disconnect event. In response, the second control module 68 may command the switch 70 closed to activate the hazard lights 58. In this way, the vehicle system 56 provides a visual warning to other vehicle drivers that motive power has been lost.

Figure 3:
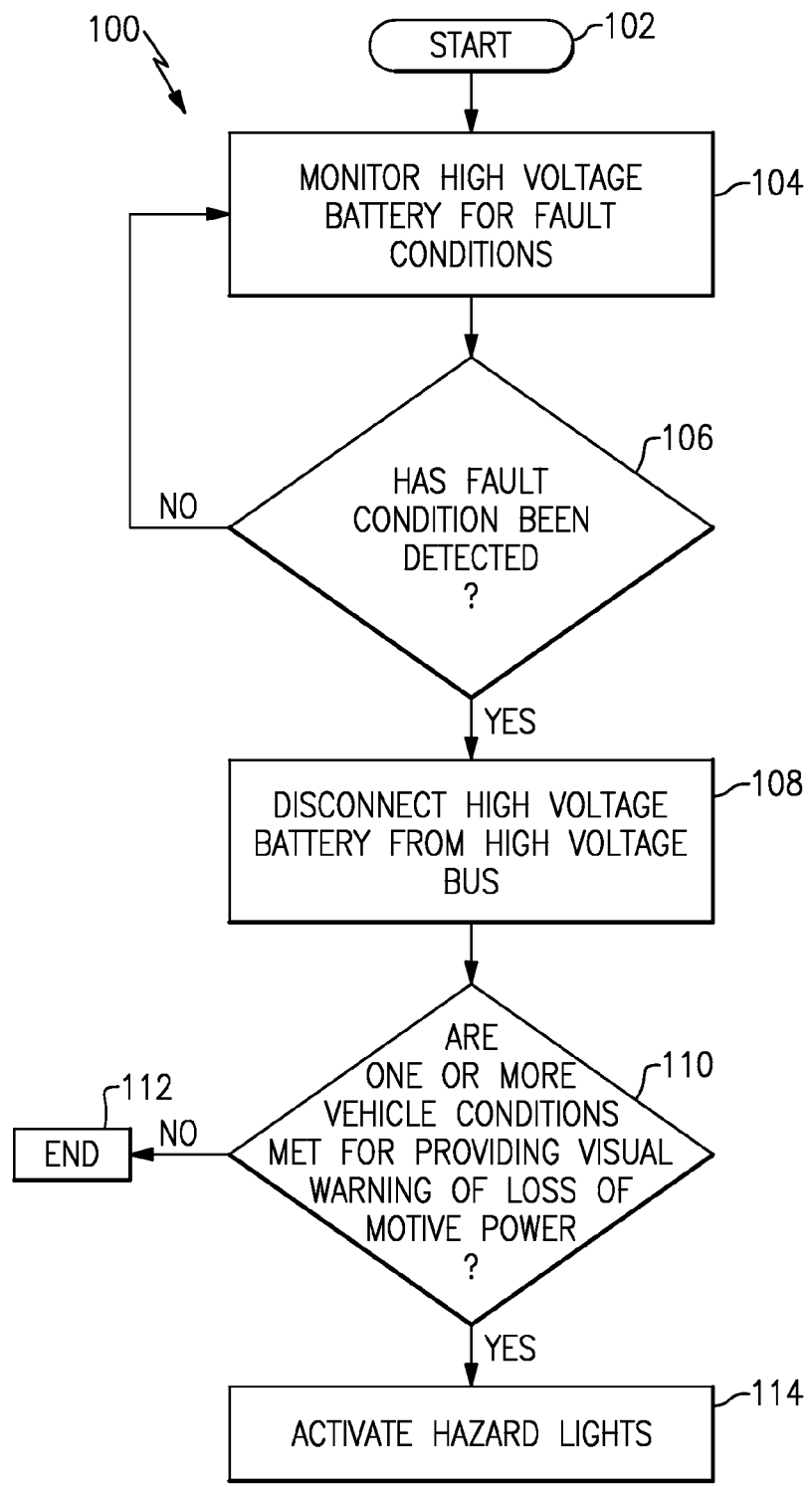
FIG. 3 schematically illustrates a control strategy for providing a visual warning that an electrified vehicle has lost motive power.

FIG. 3, with continued reference to FIGS. 1-2, schematically illustrates an exemplary control strategy 100 for controlling the vehicle system 56. For example, the control strategy 100 can be performed to provide a visual warning to other vehicle drivers by flashing the hazard lights 58 in response to high voltage battery disconnect events. The first control module 66 and the second control module 68 can be programmed with one or more algorithms adapted to execute the control strategy 100, or any other control strategy. In one non-limiting embodiment, the control strategy 100 may be stored as executable instructions in non-transitory memory of the first control module 66 and the second control module 68.

As shown in FIG. 3, the control strategy 100 begins at block 102. At block 104, the control strategy 100 monitors the high voltage battery 60 for battery fault conditions. The battery fault conditions may include, among other conditions, battery cell overcharging and/or battery cell over-discharging conditions. The first control module 66 may continuously monitor the high voltage battery 60 for such faults.

Next, at block 106, the control strategy 100 determines whether a battery fault condition has been detected. If "NO," the first control module 66 continues to monitor the high voltage battery 60. If "Yes," however, the control strategy 100 proceeds to block 108.

At block 108, the high voltage battery 60 is disconnected from the high voltage load 62. In a non-limiting embodiment, the first control module 66 commands the contactors 72 open to disconnect the high voltage battery 60 from the high voltage load 62. Opening the contactors 72 renders a high voltage battery disconnect event which causes the electrified vehicle 12 to lose motive power.

The control strategy 100 next determines whether one or more additional vehicle conditions exist for deciding whether to provide a visual warning to other drivers that the electrified vehicle 12 has lost motive power. This is schematically shown at block 110 of the control strategy 100. In a first embodiment, the control strategy 100 determines if a speed of the electrified vehicle 12 exceeds a predefined speed threshold. The predefined speed threshold is a calibratable value that may be set at any vehicle speed. In a second embodiment, the control strategy 100 determines if a power request from the operator of the electrified vehicle 12 exceeds a predefined power request threshold. The predefined power request threshold is a calibratable value that may be derived from an accelerator pedal position. In yet another embodiment, the control strategy 100 determines whether the speed of the electrified vehicle 12 exceeds a predefined speed threshold and whether a power request exceeds a predefined power request threshold. Other vehicle conditions may also be monitored for determining whether to issue the visual warning.

If the analysis at block 110 results in an answer of "NO," the control strategy ends at block 112 and no visual warning is activated. Alternatively, if the answer to block 110 is "YES," the control strategy 100 proceeds to block 114 by activating the hazard lights 58 in order to provide the visual warning of loss of motive power to other vehicle operators. The first control module 66 may communicate a signal to the second control module 68 to activate the hazard lights 58. In response to receiving this signal, the second control module 68 may command the switch 70 closed to activate the hazard lights 58 by using power from the low voltage battery 64.

Once activated, the hazard lights 58 may flash in a predefined flashing pattern to provide the visual warning to vehicles that may be nearby the electrified vehicle 12. In a non-limiting embodiment, the predefined flashing pattern used to automatically indicate a loss of motive power is a different flashing pattern than is used if the vehicle operator of the electrified vehicle 12 has specifically requested operation of the hazard lights 58, such as by depressing a button within the vehicle cabin of the electrified vehicle 12. For example, the predefined flashing pattern used to automatically indicate loss of motive power may flash the hazard lights 58 more rapidly than other flashing patterns to draw quicker attention to the electrified vehicle 12.

Although the different non-limiting embodiments are illustrated as having specific components or steps, the embodiments of this disclosure are not limited to those particular combinations. It is possible to use some of the components or features from any of the non-limiting embodiments in combination with features or components from any of the other non-limiting embodiments.

It should be understood that like reference numerals identify corresponding or similar elements throughout the several drawings. It should be understood that although a particular component arrangement is disclosed and illustrated in these exemplary embodiments, other arrangements could also benefit from the teachings of this disclosure.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A method, comprising:
    automatically activating a hazard light of a hybrid or battery electric vehicle in response to a high voltage battery disconnect event that indicates that the hybrid or battery electric vehicle has lost motive power, wherein automatically activating the hazard light includes flashing the hazard light in a manner that provides a visual warning to vehicles nearby the hybrid or battery electric vehicle.

2. The method as recited in claim 1, wherein the automatically activating step is performed if a speed of the hybrid or battery electric vehicle exceeds a predefined speed threshold.

3. The method as recited in claim 1, wherein the automatically activating step is performed if a power request from an operator of the hybrid or battery electric vehicle exceeds a predefined power request threshold.

4. The method as recited in claim 1, wherein the automatically activating step is performed if:
    a speed of the hybrid or battery electric vehicle exceeds a predefined speed threshold; and
    a power request from an operator of the hybrid or battery electric vehicle exceeds a predefined power request threshold.

5. The method as recited in claim 1, wherein the automatically activating step includes automatically flashing the hazard light without a specific request from a vehicle operator.

6. The method as recited in claim 1, comprising:
    automatically flashing the hazard light in a first flashing pattern in response to the high voltage battery disconnect event; and
    flashing the hazard light in a second, different flashing pattern in response to a specific request from a vehicle operator.

7. The method as recited in claim 1, comprising, prior to the automatically activating step, monitoring a high voltage battery of the hybrid or battery electric vehicle for fault conditions.

8. The method as recited in claim 7, comprising disconnecting the high voltage battery from a high voltage bus to cause the high voltage battery disconnect event.

9. The method as recited in claim 1, wherein the automatically activating step includes flashing the hazard light to provide a visual warning to the vehicles nearby the hybrid or battery electric vehicle if one or more additional vehicle conditions have been met in addition to the high voltage battery disconnect event.

10. The method as recited in claim 1, wherein the hazard light provide a visual warning at an external location of the hybrid or battery electric vehicle.

11. The method as recited in claim 10, wherein the visual warning is issued to vehicles separate from the electrified vehicle.

12. The method as recited in claim 1, wherein the high voltage battery disconnect event occurs in response to a battery cell overcharge fault condition.

13. The method as recited in claim 1, wherein the high voltage battery disconnect event occurs in response to a battery cell over-discharge fault condition.

14. The method as recited in claim 1, comprising monitoring a high voltage battery to detect the high voltage battery disconnect event with a first control module.

15. The method as recited in claim 14, wherein the automatically activating step is controlled by a second control module.

16. The method as recited in claim 15, wherein the second control module commands a switch closed to activate the hazard light using power from a low voltage battery in response to the high voltage battery disconnect event.

* * * * *

UNITED STATES PATENT AND TRADEMARK OFFICE
CERTIFICATE OF CORRECTION

PATENT NO. : 9,758,091 B2
APPLICATION NO. : 14/714583
DATED : September 12, 2017
INVENTOR(S) : Robert Bolduc, Masahiro Kimoto and Ken Jon Cunningham It is certified that error appears in the above-identified patent and that said Letters Patent is hereby corrected as shown below:

In the Claims

In Claim 10, Column 8, Line 39; before "a visual warning" replace "provide" with --provides--

In Claim 11, Column 8, Line 42; after "separate from the" replace "electrified" with --hybrid or battery electric--

Signed and Sealed this
Twenty-second Day of May, 2018

Andrei Iancu
*Director of the United States Patent and Trademark Office*